(12) United States Patent
Wells

(10) Patent No.: US 7,755,371 B2
(45) Date of Patent: Jul. 13, 2010

(54) IMPEDANCE MEASUREMENT OF A POWER LINE

(75) Inventor: Charles H. Wells, Portland, OR (US)

(73) Assignee: OSIsoft, Inc., San Leandro, CA (US)

(*) Notice: Subject to any disclaimer, the term of this patent is extended or adjusted under 35 U.S.C. 154(b) by 190 days.

(21) Appl. No.: 12/038,754

(22) Filed: Feb. 27, 2008

(65) Prior Publication Data

US 2008/0204054 A1 Aug. 28, 2008

Related U.S. Application Data

(60) Provisional application No. 60/891,932, filed on Feb. 27, 2007.

(51) Int. Cl.
*G01R 27/08* (2006.01)
*G01R 31/08* (2006.01)
(52) U.S. Cl. ...................... 324/713; 324/522
(58) Field of Classification Search .............. 324/713, 324/691, 649, 600, 522
See application file for complete search history.

(56) References Cited

U.S. PATENT DOCUMENTS

| | | | |
|---|---|---|---|
| 4,110,684 A * | 8/1978 | Gale | 324/522 |
| 5,397,927 A * | 3/1995 | Suelzle et al. | 307/105 |
| 5,450,328 A | 9/1995 | Janke et al. | |
| 6,466,031 B1 * | 10/2002 | Hu et al. | 324/522 |
| 7,221,166 B2 * | 5/2007 | Saha et al. | 324/522 |
| 7,400,150 B2 * | 7/2008 | Cannon | 324/522 |
| 7,417,443 B2 * | 8/2008 | Admon et al. | 324/713 |
| 2005/0083206 A1 * | 4/2005 | Couch et al. | 340/657 |

OTHER PUBLICATIONS

PCT International Search Report and Written Opinion, PCT/US08/55184, Aug. 1, 2008, 7 pages.

* cited by examiner

*Primary Examiner*—Hoai-An D Nguyen
(74) *Attorney, Agent, or Firm*—Fenwick & West LLP

(57) ABSTRACT

A system for obtaining an accurate, real-time determination of the characteristic impedance of a length of a power line that measures the operating conditions (e.g., voltage and current) for at least two locations on the power line. These measurements are synchronized so that they represent the same instant of time. The data obtained from the synchronized measurements are fitted to a circuit model of the power line to obtain a characteristic impedance for the power line, which can be used to increase the efficiency of the use of the power line and to perform real-time assessment of the power line.

20 Claims, 3 Drawing Sheets

IMPEDANCE MEASUREMENT OF A POWER LINE

CROSS REFERENCE TO RELATED APPLICATIONS

This application claims the benefit of U.S. Provisional Application No. 60/891,932, filed Feb. 27, 2007, which is incorporated by reference in its entirety.

BACKGROUND

This invention relates generally to power transmission electronics and in particular to measuring and using the real-time impedance of a power line used for transmission of electrical power.

Electrical power is carried over the grid to consumers by a network of power lines. These power lines span various types of terrain and experience a wide variety of ever-changing environmental conditions, and the lines themselves vary in their materials and construction. Not only are the operating conditions constantly changing, the power transmitted via power lines also changes based on the supply and demand for the power. This causes variations in the temperature of these lines, which tend to sag (and thus increase in length and decrease in cross sectional area) when their temperature increases. For these reasons, power lines generally have dynamically changing properties, such as impedance, which variably affect their performance over time.

One important characteristic of a power line is its ampacity, which is a measurement of an amount of electric current that the power line can carry under specified temperature limitations and within a specified environment. The ampacity of a power line is based on many factors, including the physical and electrical properties of the conductor, as well as the temperature, wind, and other environmental conditions surrounding the power line. As the properties of a power line (e.g., impedance) change, the ampacity also changes. Currently, power transmission systems fail to take into account all of the important dynamic properties of a power line, which leads to the underutilization of the power lines. This can be a significant problem if the power lines are congested, where the lines are operating at or near their maximum. In the United States, for example, the cost of congestion in power lines may exceed $8 billion per year. The cost of supplying power increases in congestion cases, since power has to be purchased from generators located closer to the load, and hence at higher costs. Accordingly, a significant savings can be achieved each year by increasing the ampacity of congested power lines.

Accordingly, what are needed are techniques for determining accurate, real-time impedances for power lines, thereby allowing more accurate estimation of the properties of a power line (such as ampacity). This would enable many benefits, including more efficient use of power lines, as well as detecting faults and determining the stability of a power line.

SUMMARY

To obtain an accurate, real-time determination of the characteristic impedance of a length of a power line, embodiments of the invention measure the operating conditions for at least two locations on the power line. These conditions include the voltage and current in the power line for these locations, as well as the relative phase angle, and the measurements are synchronized so that they are measured the same instant of time. The data obtained from the synchronized measurements are then fitted to a circuit model of the power line to obtain the characteristic impedance parameters for the power line according to the circuit model. This yields a set of values that describe the characteristic impedance for the measured length of the power line.

The resulting characteristic impedance of the power line can be used for a number of purposes, including local and wide area protection as well as direct grid feedback control. For example, with more accurate information about the dynamic impedance of a power line, an operator can increase or decrease the power delivered over the power line based on a better understanding of the power line's ampacity. In addition, this enables a more accurate estimation of fault locations and thus dramatically reduces down time. Moreover, the information resulting from a continuous calculation of impedance parameters (which may include resistance, inductance, and capacitance components), damping coefficients, and locations of complex eigenvalues enable an operator to perform real-time stability assessment of the power grid.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Embodiments of the invention obtain measurements from different locations on a power line to determine the characteristic impedance for a length of the power line between the two locations. This characteristic impedance may be expressed as estimates of a set of parameters according to a circuit model of the power line, such as a π-circuit. These parameter estimates may also be updated at regular intervals (e.g., at 50 or 60 Hz), thereby providing an accurate estimate of the real-time dynamic impedance of the power line. The representations can be either lumped parameter or distributed types of models.

Figure 1:
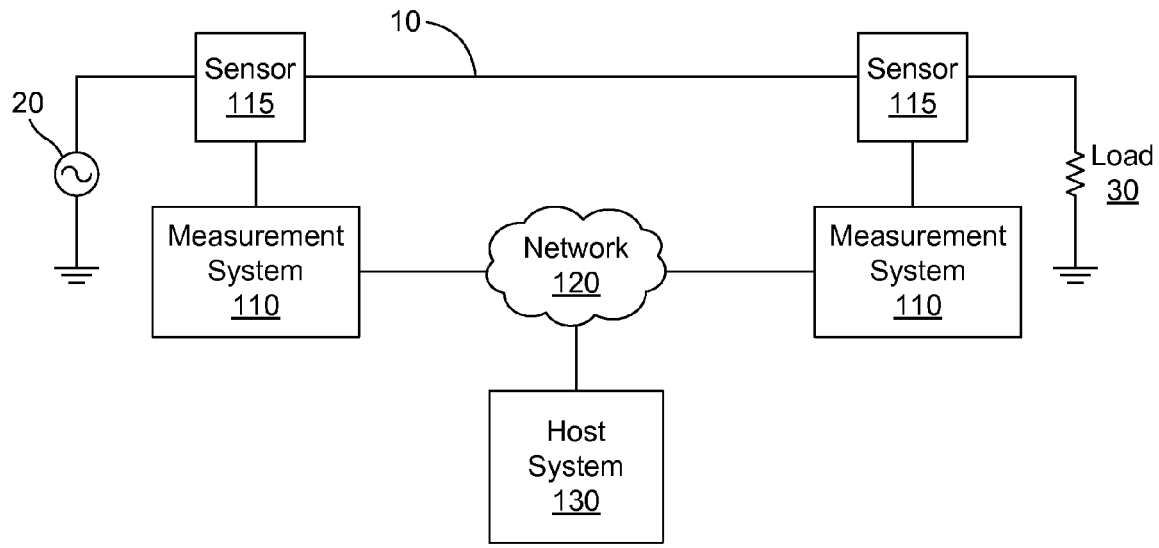
FIG. 1 is a diagram of a power line measurement system, in accordance with an embodiment of the invention.

FIG. 1 is a simplified diagram of a power line 10, which is configured to carry electrical power produced at a first location by a generator 20. The power line 10 carries the produced electrical power on the power line 10 to another location, where this power is consumed by a load 30. In a practical implementations, it can be appreciated that the power line 10 may include any number of generators 20 and various different loads 30, and there would be any combination of branches and nodes to form a network of power lines 10 or power grid.

FIG. 1 also illustrates a system for determining a real-time impedance of the power line 10, in accordance with an embodiment of the invention, comprising a set of measurement systems 110. Each measurement system 110 is placed at a particular location along the power line 10. Each measurement system 110 may be integrated with or attached to a sensor 115, which can be coupled to the power line 10 to measure a voltage and/or a current of the power line 10 at that location. Accordingly, the sensors 115 coupled to the power line 10 provide samples of the power line's voltage and current to the corresponding measurement systems 110. Each measurement system 110, in turn, is configured to perform any required processing on this data, as described below, and then forward the data over a network 120 to a host system 130. At the host system 130, these data are processed to determine the real-time impedance of the length or portion of the power line 10 between the two locations on the line 10 from where the data were taken. Additional information may be created from the direct measurements of voltage and current, including real and reactive power and absolute phase angle in each of the three phases.

The measurement systems 110 and sensors 115 may be placed along the power line 10 at any location that may be an endpoint of a segment of the power line 10 for which an impedance is to be computed. In more complex power grids, therefore, any number of measurement systems 110 and sensors 115 may be used. The measurement systems 110 may be coupled to the host system 130 by a local-area network, a wide-area network (such as the Internet), a cellular or other wireless network, or any appropriate communication network.

Figure 2:
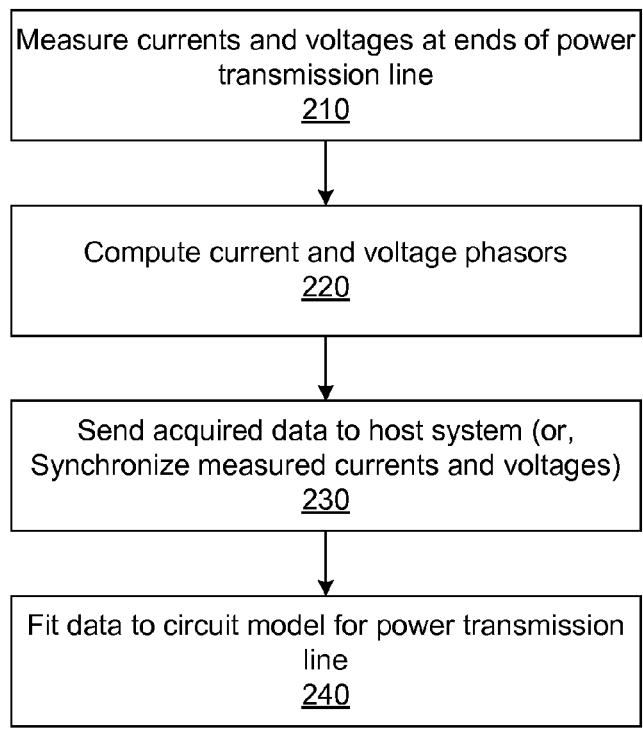
FIG. 2 is a diagram of a method for measuring the impedance between two locations on a power line, in accordance with an embodiment of the invention.

FIG. 2 illustrates an operation of a method for determining the real-time impedance of a power line 10, using for example the system illustrated in FIG. 1. In this method, the sensors 115 measure 210, at each end of a length of the power line 10, the current and voltage at the respective locations on the power line 10. In one embodiment, the power line 10 comprises a three-phase power line, in which case the sensors 115 measure a voltage and a current for each off the phases of the line 10 at each location. Each sensor may perform a series of measurements of voltage and current, and then send the acquired data to the corresponding measurement system 110. In one embodiment, each sensor 115 is controlled by its respective measurement system 110 and takes measurements at a rate sufficient to capture high-frequency components of the associated signals (e.g., about 60 kHz).

At each measurement system 110, the data samples for the measured currents and voltages are used to compute 220 phasors for the current and voltage. In one embodiment, the phasors are computed using the clock (e.g., the "top of second" signal) from the GPS module 150 to synchronize the beginning of a reporting period. The IEEE standard C37.118 defines zero phase angle when the maximum of the cosine wave at nominal frequency coincides with the top of second peak. Each PMU manufacturer may determine the absolute phase angle with any method of their choosing. One common method is outlined by Phadke. A typical phasor measurement unit (PMU) provides 12 phasors, which includes the magnitude and angle for the three voltages and three currents.

The measurement systems 110 may also match the data to timestamps to indicate when the data were acquired, as well as provide location information and/or environmental data (e.g., temperature and wind speed) for their corresponding locations. The measurement systems 110 may further digitize the data and then send 230 the data to the host system 130 over a network 120. As described in more detail below, the host system then fits 240 the data to a model for the power line 10 to obtain an estimate for the impedance of the length of the power line 10 between the two locations. The estimated impedance can be output for various useful purposes, including for display to an operator, for storage in a database on a tangible computer-readable medium, and/or for use by another system or for further processing.

The time required for the packets to arrive at the host system 130 varies (typically, from 10 to 150 ms). Therefore, the data are time-aligned at the host system 130 before the calculations are made. In one embodiment, this alignment is made by using the timestamps associated with the data as provided by the measurement units 110.

It can be appreciated that variations on this basic system architecture and method of operation are possible. For example, the measurement system 110 may itself sense the currents and voltages, thereby eliminating the need for separate sensors 115. Additionally, the measurement systems 110 may perform more or less of the data processing themselves, leaving the remainder of the required processing to be done by the host system 130. Moreover, the need for a host system 130 may be eliminated entirely by moving its processing functionality to one or more of the measurement systems 110.

Figure 3:
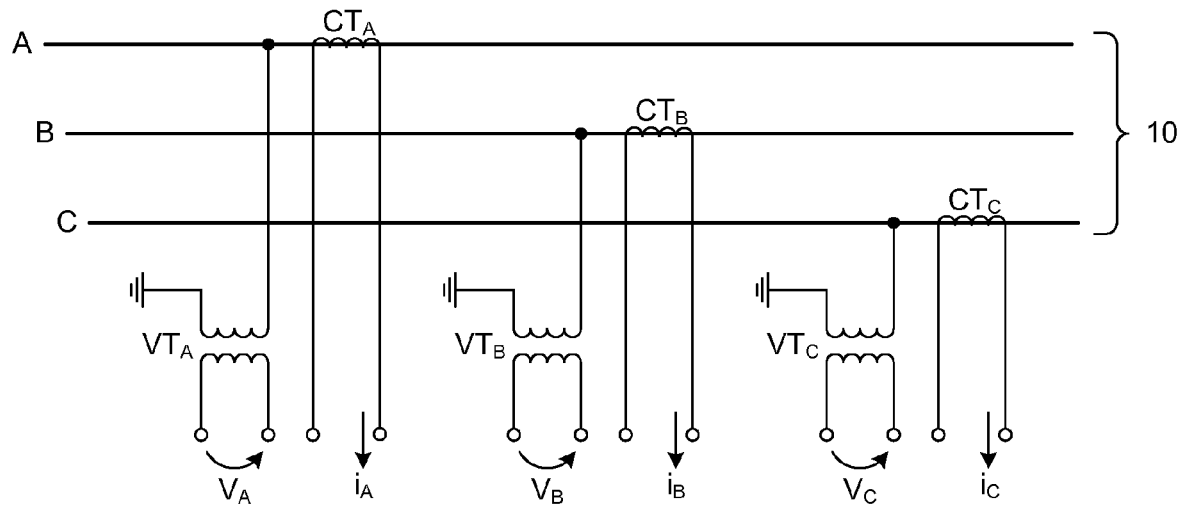
FIG. 3 is a schematic drawing of a remote sensing unit for measuring current and voltage at a location on a power line, in accordance with an embodiment of the invention.

FIG. 3 illustrates one implementation of the sensor 115 illustrated in FIG. 1. As shown, the power line 10 comprises a three-phase conductor, where the phases are carried on separate lines labeled A, B, and C. The sensor 115 is therefore configured to measure the voltage and current for each phase. In this embodiment, the sensor 115 comprises a voltage transformer VT and a current transformed CT coupled to each line A, B, and C. In this way, voltage transformer $VT_A$ measures the voltage of line A, current transformer $CT_A$ measures the current though line A, and so on. The transformers VT and CT beneficially step the respective voltages and currents down from the power line 10 to a level that can be handled by conventional circuitry and provide safety for personnel working in the substations.

Figure 4:
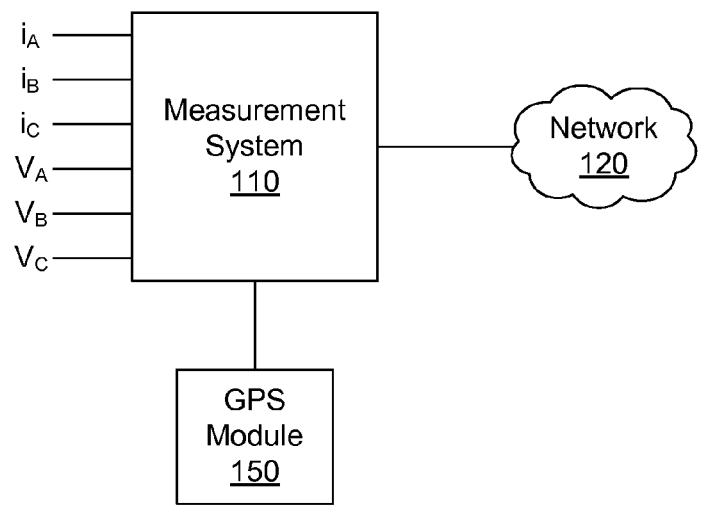
FIG. 4 is a diagram of a measurement system, in accordance with an embodiment of the invention.

FIG. 4 illustrates a measurement system 110 configured to receive the analog signals representing the voltages and currents of the three phases of the power line 10 illustrated in FIG. 3. As described above, the measurement system 110 is configured to sample these voltage and current signals to obtain digital data representing the voltages and currents for the power line 10 at this location. The measurement system 110 may also contain logic for converting the voltage and current information into phasor measurements, including voltage, current, power, frequency, real and reactive power, and absolute phase angle and other derived measurements.

The measurement system 110 may further associate the voltage and current data with a timestamp so that the data can be synchronized with data taken at a different location on the line 10 and by a different measurement system 110. In one embodiment, the measurement system obtains the timestamp from a GPS module 150 coupled to or contained within the measurement system 110. One benefit of obtaining the timestamp from the GPS module 150 is that each of the measurement systems 110 distributed across the power line 10 will be synchronized because they will each be obtaining the timestamp from the same GPS satellite signal. This signal is accurate to more than one microsecond (since the pulse is 10 ns wide). The measurement system 110 may further obtain location information from the GPS module 150 and associate that location information with the data that it obtains from the power line 10. In other embodiments, different location discovery techniques can be used, or the actual location may be manually programmed into the measurement system 110 or the host system 130 when the measurement systems 110 are installed.

In this way, the measurement system 110 provides time-synchronized measurements of voltage, current, power, frequency, and phase angle in standard digital format. Once the data is obtained, it is transmitted to the host system 130 via a network 120. As explained above, any suitable network connection may be used.

Figure 5:
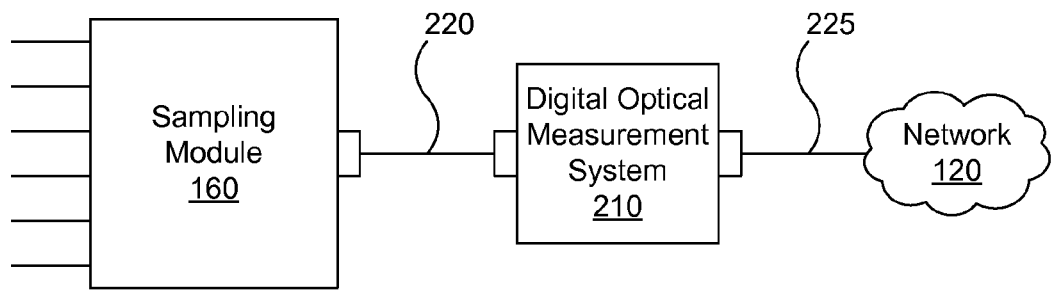
FIG. 5 is a diagram of a digital optical measurement system, in accordance with another embodiment of the invention.

FIG. 5 illustrates an alternative embodiment of the measurement system 210, which is configured to receive digital data over an optical medium. In this embodiment, the system includes a sampling module 160 coupled to the sensor 115 for sampling the voltage and current measurements from the power line 10. The sampling module 160 contains logic for controlling the sampling of the analog voltage and current signals, performing analog-to-digital conversion of the samples, and multiplexing the digital data onto an optical fiber line 220. The digital optical measurement system 210 receives the digital data and processes the data, for example, as described the analog counterpart system 110 described in FIG. 4. The digital optical measurement system 210 then transmits the processed data via network 120 to the host system 130, preferably using another optical fiber line 225.

Benefits of the configuration shown in FIG. 5 include the ability to perform the sampling near the power line 10, which carries a relatively high voltage and current. The measurement system 210 can then be located away from the actual power line 10, which can interfere with the electronic components of a computing system. Use of fiber lines 220 and 225 for carrying the signals rather than electrical conductors also helps to reduce electrical interference from the power lie 10.

In another embodiment, one or more sensors sample the voltages and currents and then digitize that information on the high voltage side of the power line 10, without having to step down the voltages and/or currents. The sampled digital data can then be passed to the measurement system for further processing.

In another embodiment, the voltages and currents are measured from the power line 10 directly using fiber optic transmitted power to the high voltage side of the instrument transformers, and then sending digital data through a fiber optic line to the local receiver in the substation. The digital data can be processed by a measurement system to calculate phasors for the current and voltage measurements. All three phases are interfaced to the measurement system so that the positive, negative, and zero sequences can be also computed. A sensor system for measuring voltage and current of a power line directly using a fiber cable is offered by Arbiter Systems, of Paso Robles, Calif. One of the standard products sold by Arbiter Systems for performing phasor measurements is called the 1133a Power Sentinel.

Figure 6:
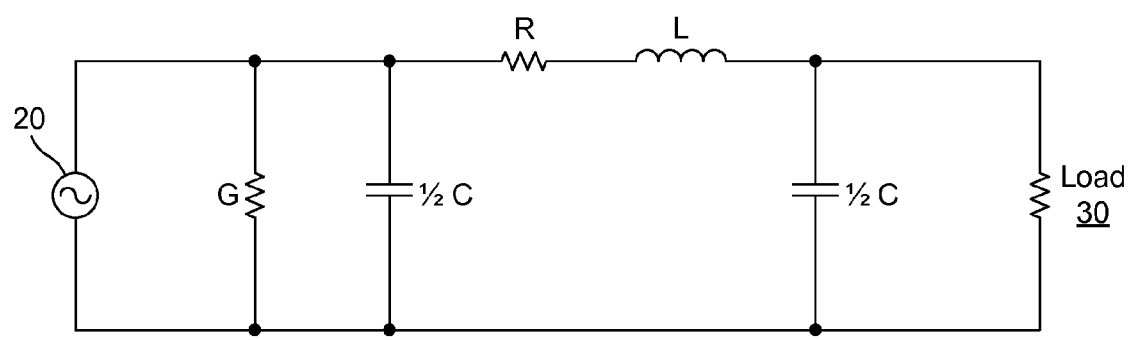
FIG. 6 is a schematic drawing of an electrical circuit model of the impedance of a power line, in accordance with an embodiment of the invention.

Once the voltage and current data are obtained, the data are fitted against a model to estimate the characteristic impendence for the power line. In one embodiment, the power line is modeled by a π-circuit, an example of which is shown in FIG. 6. In this π-circuit model, a generator 20 drives power to a load 30 through a network comprising one or more resistances, capacitances, and inductances. In this example, the π-circuit includes a shunt (or ground) resistance G, a series resistance R, a series inductance L, and a shunt capacitance C. However, it is appreciated that variations on this model are possible and may be used in other embodiments. For example, the shunt capacitance C may be modeled as a single capacitance on either side of the series resistance and/or series inductance, or it may be split up into multiple parallel capacitances as shown in FIG. 6.

The parameters G, R, L, and C in the π-circuit provide a measure of the impedance of the power line 10. In embodiments of the techniques described herein, these parameters are unknown, as the impedance of the power line 10 may vary over time. Accordingly, a model used to determine these parameters for the power line 10 based on the dynamic real-time measurements made at various locations on the power line 10, as described above.

The circuit illustrated in FIG. 6 can be represented by a set of partial differential equations, as outlined for example in Ilic & Zaborszky, *Dynamics and Control of Large Electric Power Systems*, Wiley Interscience (2000), p. 74-75. The equations can also be represented in phasor format as well as approximated as phasor differential equations, as explained in this text and reproduced below:

$$\hat{E}_i = \hat{E}_j \cosh \hat{p}l + \hat{I}_j \hat{Z}_o \sinh \hat{p}l$$

$$\hat{I}_i = \frac{\hat{E}_j}{\hat{Z}_0} \sinh \hat{p}l + \hat{I}_j \cosh \hat{p}l$$

where $\hat{Z}_0$ is known as the characteristic impedance and $\hat{p}$ is the propagation constant. These equations relate the phasor voltage and current at one location on a power line (i.e., $\hat{E}_i$ and $\hat{I}_i$) and the phasor voltage and current at another location on the power line (i.e., $\hat{E}_j$ and $\hat{I}_j$) to the characteristic impedance (i.e., $\hat{Z}_0$) of the power line between those two locations. Using the model for the power line shown in FIG. 6, the characteristic impedance is related to the parameters G, R, L, and C according to the equations:

$$\hat{z} = R + j\omega L$$

$$\hat{z}' = G + j\omega C$$

where $$\hat{Z}_0 = \sqrt{\hat{z}\hat{z}'},$$

With accurate measurements of voltage and current at two locations on the power line, therefore, the equations can be used to solve for the parameters G, R, L, and C for the model of the power line can be determined in real time based on data measured at two different locations on the power line.

Various well known mathematical techniques can be used to solve these equations to obtain real-time identification of the characteristic impedance. In one example, a computing system receives a set of data that comprises synchronized samples of the voltages and currents at two different locations on the power line 10. A best fit for the model is then obtained for these samples to find a characteristic impedance that yields the smallest error between the data and the model. The best fit may be obtained using any number of known techniques, such as a least squares fit that minimizes the square of an error term, and iterative techniques for reducing the error by selecting different values for the characteristic impedance. Since the characteristic impedance may comprise multiple parameters (e.g., the four parameters G, R, L, and C in the model of FIG. 6), the error minimization algorithm may find the best fit characteristic impedance by adjusting each of these parameters. A number of multidimensional, nonlinear curve fitting techniques are well known and can be used for this determination.

Once an accurate real-time determination is made for the characteristic impedance of the power line, a number of beneficial applications may be achieved. For example, the ampacity of a power line is generally determined by the amount of sag in the power line. This sag is a function of time and temperature and can be estimated based on the thermal conductivity of the line. The sag changes throughout the day based on temperature, wind speed, and humidity (due to the thermal film coefficient of the conductor). The ampacity is also a function of the impedance of the power line. For example, the coefficient of thermal expansion can be used to compute the effective increase in line length due to the increase in the value of R, the series resistance. Therefore, with more accurate knowledge of the power line's impedance an operator can adjust the power carried on the power line to increase efficient use of that power line. By determining the available line ampacity in real time, the additional line capacity can then be bid into the power markets as a spinning reserve.

In another embodiment, once the lumped-parameter representation of the π-circuit is determined, as described above, it is possible also to calculate the eigenvalues of this circuit in real time. This is somewhat similar to the Prony method, but uses the non-linear representation of the circuit rather than a second order linear differential equation. One method of computing the eigenvalues is to linearize the current value of the circuit equations around the current value of the impedance parameters. Then, the eigenvalues can be determined directly from the linear differential equation. This can be done in at least two standard software packages, MatLab and MathCad.

In another embodiment, real time moving window Fast Fourier Transforms (FFTs) of the angle, power, and frequency measurement of the power line are performed. One can compute the FFT of the difference between the frequencies at either end of the line. This is a very small value, on the order of 0.001-0.003 Hz; however, the FFT of this difference signal can be used to find the oscillation modes of the PI circuit. More about this is described in U.S. application Ser. No. 11/008,632, filed Dec. 8, 2004, which is incorporated by reference in its entirety.

In another embodiment, the actual power loss in the power line is calculated using this computed characteristic impedance. This computed actual power loss can then be used to compute the real-time locational marginal price (LMP) associated with this loss of transmission capacity for the corresponding section of the grid. One formula for computing this is:

$$P = \frac{V_1 V_2 \sin(\text{angle})}{X},$$

where X is the characteristic impedance.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method for determining a real-time impedance of a power line, the method comprising:
   measuring a voltage and a current at a first location on the power line for a plurality of times;
   measuring a voltage and a current at a second location on the power line for a plurality of times, wherein the measured voltages and currents at the first and second locations are synchronized in time;
   fitting the measured voltages and currents from the first and second locations to a circuit model for the power line by adjusting one or more parameters of the circuit model;
   estimating a characteristic impedance of the power line between the first and second locations thereof based on the parameters of the circuit model; and
   outputting the estimated characteristic impedance.

2. The method of claim 1, further comprising:
   computing phasors for the measured voltages and currents from the first and second locations, wherein the computed phasors are used in the fitting.

3. The method of claim 1, wherein the circuit model of the power line is a π-circuit.

4. The method of claim 1, wherein the parameters of the circuit model comprise a shunt resistance, a series resistance, a series inductance, and a shunt capacitance.

5. The method of claim 1, wherein measuring the voltages and currents from the first and second locations comprises:
obtaining the measured voltages and currents at voltage and current levels near the power line;
digitizing the measured voltages and currents; and
transmitting the digitized measured voltages and currents via an optical fiber line.

6. The method of claim 1, further comprising:
computing a real-time ampacity for the power line based on the estimated characteristic impedance.

7. The method of claim 1, further comprising:
locating a fault in the power line based on the estimated characteristic impedance.

8. The method of claim 1, further comprising:
computing a measure of stability of the power line using eigenvalues computed based on the estimated characteristic impedance.

9. The method of claim 1, further comprising:
computing a measure of stability of the power line based on an FFT of a difference between frequencies at the first and second locations on the power line.

10. The method of claim 1, further comprising:
computing a real-time locational marginal price (LMP) associated with a loss of transmission capacity for the power line, based on the estimated characteristic impedance.

11. A measurement system for determining a real-time impedance of a power line, the system comprising:
a plurality of sensors, each sensor configured to measure a voltage and a current at first and second locations, respectively, on the power line for a plurality of times;
a plurality of measurement systems, each measurement system configured to receive a set of measured voltages and currents from a sensor; and
a host system for receiving data representing the measured voltages and currents from a set of measurement systems, wherein the measured voltages and currents for the first and second locations are synchronized in time, the host system further configured to fit the measured voltages and currents to a circuit model for the power line by adjusting one or more parameters of the circuit model and estimate a characteristic impedance for a length of the power line therefrom.

12. The system of claim 11, wherein each measurement system is configured to compute phasors for the measured voltages and currents and provide the computed phasors to the host system.

13. The system of claim 11, wherein the circuit model of the power line is a $\pi$-circuit.

14. The system of claim 11, wherein the parameters of the circuit model comprise a shunt resistance, a series resistance, a series inductance, and a shunt capacitance.

15. The system of claim 11, wherein the sensors are configured to obtain the measured voltages and currents at voltage and current levels near the power line, digitize the measured voltages and currents, and transmit the digitized measured voltages and currents via an optical fiber line to a measurement system.

16. The system of claim 11, wherein the host system is further configured to compute a real-time ampacity for the power line based on the estimated characteristic impedance.

17. The system of claim 11, wherein the host system is further configured to locate a fault in the power line based on the estimated characteristic impedance.

18. The system of claim 11, wherein the host system is further configured to compute a measure of stability of the power line using eigenvalues computed based on the estimated characteristic impedance.

19. The system of claim 11, wherein the host system is further configured to compute a measure of stability of the power line based on an FFT of a difference between frequencies at the first and second locations on the power line.

20. The system of claim 11, wherein the host system is further configured to compute a real-time locational marginal price (LMP) associated with a loss of transmission capacity for the power line, based on the estimated characteristic impedance.

* * * * *